(12) United States Patent
Wells et al.

(10) Patent No.: US 11,536,767 B2
(45) Date of Patent: Dec. 27, 2022

(54) SELF-TEST CIRCUITRY

(71) Applicant: Cirrus Logic International Semiconductor Ltd., Edinburgh (GB)

(72) Inventors: James Wells, Edinburgh (GB); Saurabh Singh, Edinburgh (GB); Huy Binh Le, Edinburgh (GB); Gavin Wilson, Edinburgh (GB); Niall McGurnaghan, Edinburgh (GB); Simon R. Foster, Reading (GB); Mark McCloy-Stevens, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 280 days.

(21) Appl. No.: 17/065,799

(22) Filed: Oct. 8, 2020

(65) Prior Publication Data

US 2021/0148968 A1    May 20, 2021

Related U.S. Application Data

(60) Provisional application No. 62/938,106, filed on Nov. 20, 2019.

(30) Foreign Application Priority Data

May 5, 2020 (GB) ..................................... 2006641

(51) Int. Cl.
*G01R 31/28* (2006.01)
*G01R 31/56* (2020.01)

(52) U.S. Cl.
CPC ......... *G01R 31/2884* (2013.01); *G01R 31/56* (2020.01)

(58) Field of Classification Search
CPC ................ G01R 31/2884; G01R 31/56; G01R 31/31715; G01R 31/31924; G01R 31/3187; G01R 31/327

(Continued)

(56) References Cited

U.S. PATENT DOCUMENTS 6,140,821 A    10/2000 Fendt et al.
9,551,751 B2 *    1/2017 Brazis, Jr. .......... G01R 31/3272
(Continued)

FOREIGN PATENT DOCUMENTS

DE    102008003702 A1    7/2009

OTHER PUBLICATIONS

Combined Search and Examination Report under Sections 17 and 18(3), UKIPO, Application No. GB2006641.1, dated Feb. 5, 2021.
(Continued)

*Primary Examiner* — Giovanni Astacio-Oquendo
(74) *Attorney, Agent, or Firm* — Jackson Walker L.L.P.

(57) ABSTRACT

The present disclosure relates to self-test circuitry for a system that includes one or more current control subsystems, each current control subsystem having a load terminal for coupling the current control subsystem to a load. The self-test circuitry comprises: a signal path associated with each current control subsystem, each signal path configured to selectively couple a measurement node to the load terminal of the current control subsystem, wherein the measurement node is common to all of the signal paths; voltage detection circuitry; and test voltage source circuitry configured to provide a test voltage to the measurement node. The voltage detection circuitry is operable to output a signal indicative of a fault condition if a voltage detected at the measurement node differs from the test voltage when the measurement node is coupled to the load terminal.

24 Claims, 8 Drawing Sheets

(58) Field of Classification Search
USPC .................................... 324/750.3, 537, 500
See application file for complete search history.

(56) References Cited

U.S. PATENT DOCUMENTS

| | | | |
|---|---|---|---|
| 10,507,779 B2* | 12/2019 | Zuschlag | G01R 31/006 |
| 11,221,356 B2* | 1/2022 | Putz | G01R 27/18 |
| 2011/0031978 A1 | 2/2011 | Garneyer et al. | |
| 2013/0127441 A1* | 5/2013 | Tseng | G01R 31/31924 |
| | | | 324/76.11 |
| 2013/0268025 A1 | 10/2013 | Ranu | |
| 2015/0025830 A1* | 1/2015 | Elias | G01R 31/2851 |
| | | | 702/120 |
| 2019/0227586 A1* | 7/2019 | Shafeeu | G05F 1/461 |
| 2019/0302162 A1* | 10/2019 | Colarossi | G01R 31/2829 |

OTHER PUBLICATIONS

Combined Search and Examination Report under Sections 17 and 18(3), UKIPO, Application No. GB2201964.0, dated Feb. 23, 2022.

\* cited by examiner

SELF-TEST CIRCUITRY

FIELD OF THE INVENTION

The present disclosure relates to the field of self-test circuitry. In particular, the present disclosure relates to self-test systems for use in driver circuitry, for example a current sink driver system.

BACKGROUND

Modern electronic devices such as mobile telephones, laptop and tablet computers, smart glasses, gaming devices such as games consoles, and accessory devices such as headphones, earphones, ear buds and virtual reality/augmented reality headsets include complex circuitry and processing systems. It is desirable in such devices to be able to test that the circuitry and/or processing systems are functioning correctly before use of the device, to ensure that the device can be used reliably and/or safely by a user.

A built-in self-test (BIST) system is a mechanism that permits a machine or device such as an integrated circuit (IC) to test itself. It is useful to provide BIST systems that can be used for the testing of different components within such a device. For example, an electronic device of the kind discussed above may include one or more BIST systems configured to perform self-testing of ICs or other circuitry, systems or subsystems of the device.

SUMMARY

According to a first aspect, the invention provides self-test circuitry for a system that includes one or more current control subsystems, each current control subsystem having a load terminal for coupling the current control subsystem to a load, the self-test circuitry comprising:
- a signal path associated with each current control subsystem, each signal path configured to selectively couple a measurement node to the load terminal of the current control subsystem, wherein the measurement node is common to all of the signal paths;
- voltage detection circuitry; and
- test voltage source circuitry configured to provide a test voltage to the measurement node,
- wherein the voltage detection circuitry is operable to output a signal indicative of a fault condition if a voltage detected at the measurement node differs from the test voltage when the measurement node is coupled to the load terminal.

The one or more current control subsystems may comprise one or more current source subsystems and/or one or more current sink subsystems.

The test voltage source circuitry may comprise current generator circuitry and a resistance.

Alternatively, the test voltage source circuitry may comprise voltage divider circuitry configured to generate the test voltage based on a test voltage source reference voltage.

The voltage divider circuitry may comprise first and second voltage divider resistances of substantially equal value connected in series such that the test voltage is substantially equal to half of the reference voltage.

The voltage detection circuitry may be configured to output a signal indicative of a short circuit between the load terminal and a system supply voltage if the detected voltage at the measurement node is equal or close to the system supply voltage The voltage detection circuitry may be configured to output a signal indicative of a short circuit between the load terminal and a system reference voltage if the detected voltage at the measurement node is equal or close to the system reference voltage.

Each signal path may comprise a controllable switch device for selectively coupling the measurement node to the load terminal of the associated current control subsystem.

The self-test circuitry may further comprise a first resistance for each current control subsystem. The first resistance may be selectively couplable between the load terminal of the current control subsystem and a system reference voltage.

The self-test circuitry may further comprise a controllable coupling switch associated with each first resistance, each controllable coupling switch being configured to selectively couple the associated first resistance to the relevant signal path.

A resistance value of each first resistance may be substantially equal to the value of the first and second voltage divider resistances.

The voltage detection circuitry may be configured to output a signal indicative of a short circuit between a load terminal of a current source subsystem and a load terminal of a current sink subsystem if the detected voltage at the measurement node is less than the test voltage when the measurement node is coupled to the load terminal of one of the current source subsystem and the current sink subsystem and a first resistance is coupled between the signal path associated with the other of the current source subsystem and the current sink subsystem and the system reference voltage.

The self-test circuitry may further comprise current sink circuitry associated with a current source subsystem, the current sink circuitry being selectively couplable to the signal path associated with the current source subsystem. The voltage detection circuitry may be operable to output a signal indicative of a fault condition if a voltage detected at the load terminal of the current source subsystem differs from a first expected voltage when the current source subsystem is disabled or if the detected voltage differs from a second expected voltage when the current source subsystem is enabled.

The first expected voltage may be based on a system reference voltage and the second expected voltage may be based on a system supply voltage.

The self-test circuitry may further comprise:
- a common conductive path coupled to each of a plurality of current sink subsystems; and
- current sensing circuitry configured to measure a current in the common conductive path.

The current sensing circuitry may be configured to output a signal indicative of a fault condition if the measured current in the common conductive path differs from a first expected current when the plurality of current sink subsystems are enabled, and to output a signal indicative of a fault condition if the measured current in the common conductive path differs from a second expected current when the plurality of current sink subsystems are disabled.

The first expected current may be based on a predetermined test current value.

The second expected current may be zero.

The current sensing circuitry may be further configured to output a signal indicative of a fault condition if the measured current in the common conductive path differs from a second expected current when one the plurality of current sink subsystems is enabled and the others of the plurality of current sink subsystems are disabled.

According to a second aspect, the invention provides self-test circuitry for a system that includes a current source subsystem and a current sink subsystem, wherein the current source subsystem and the current sink subsystem each have a load terminal for coupling to a load, the self-test circuitry comprising:
   a resistance, wherein the resistance is couplable between one of the load terminal of the current source subsystem and the load terminal of the current sink subsystem and a system reference voltage;
   a measurement node, wherein the measurement node is couplable to the other of the load terminal of the current source subsystem and the load terminal of the current sink subsystem;
   test voltage source circuitry configured to provide a test voltage to the measurement node; and
   voltage detection circuitry, wherein the voltage detection circuitry is configured to output a signal indicative of a short circuit between the load terminal of the current source subsystem and the load terminal of the current sink subsystem if the detected voltage at the measurement node differs from the test voltage when the resistance is coupled between the one of the load terminal of the current source subsystem and the load terminal of the current sink subsystem and the system reference voltage and the measurement node is coupled to the other of the load terminal of the current source subsystem and the load terminal of the current sink subsystem.

The system reference voltage may be 0 volts.

According to a third aspect, the invention provides an integrated circuit comprising self-test circuitry according to the first or second aspect.

According to a fourth aspect, the invention provides an electronic device comprising circuitry according to any of the first to third aspects.

The device may comprise a mobile telephone, a tablet or laptop computer, a wearable device, a gaming device, a virtual reality or augmented reality device, for example.

According to a fifth aspect, the invention provides self-test circuitry for a system that includes a current source subsystem, wherein the current source subsystem has a load terminal for coupling to a load, the self-test circuitry comprising:
   current sink circuitry associated with the current source subsystem, the current sink circuitry being selectively couplable to a signal path associated with the current source subsystem; and
   voltage detection circuitry, wherein the voltage detection circuitry is operable to output a signal indicative of a fault condition if a voltage detected at the load terminal of the current source subsystem differs from a first expected voltage when the current source subsystem is disabled or if the detected voltage differs from a second expected voltage when the current source subsystem is enabled.

According to a sixth aspect, the invention provides self-test circuitry for a system that includes a plurality of current sink subsystems, wherein each current sink subsystem has a load terminal for coupling to a load, the self-test circuitry comprising:
   a common conductive path coupled to each of the plurality of current sink subsystems; and
   current sensing circuitry configured to measure a current in the common conductive path,
   wherein the current sensing circuitry is configured to output a signal indicative of a fault condition if the measured current in the common conductive path differs from a first expected current when the plurality of current sink subsystems are enabled, and to output a signal indicative of a fault condition if the measured current in the common conductive path differs from a second expected current when the plurality of current sink subsystems are disabled.

BRIEF DESCRIPTION OF THE DRAWINGS

Embodiments of the invention will now be described, strictly by way of example only, with reference to the accompanying drawings, of which.

DETAILED DESCRIPTION

Figure 1:
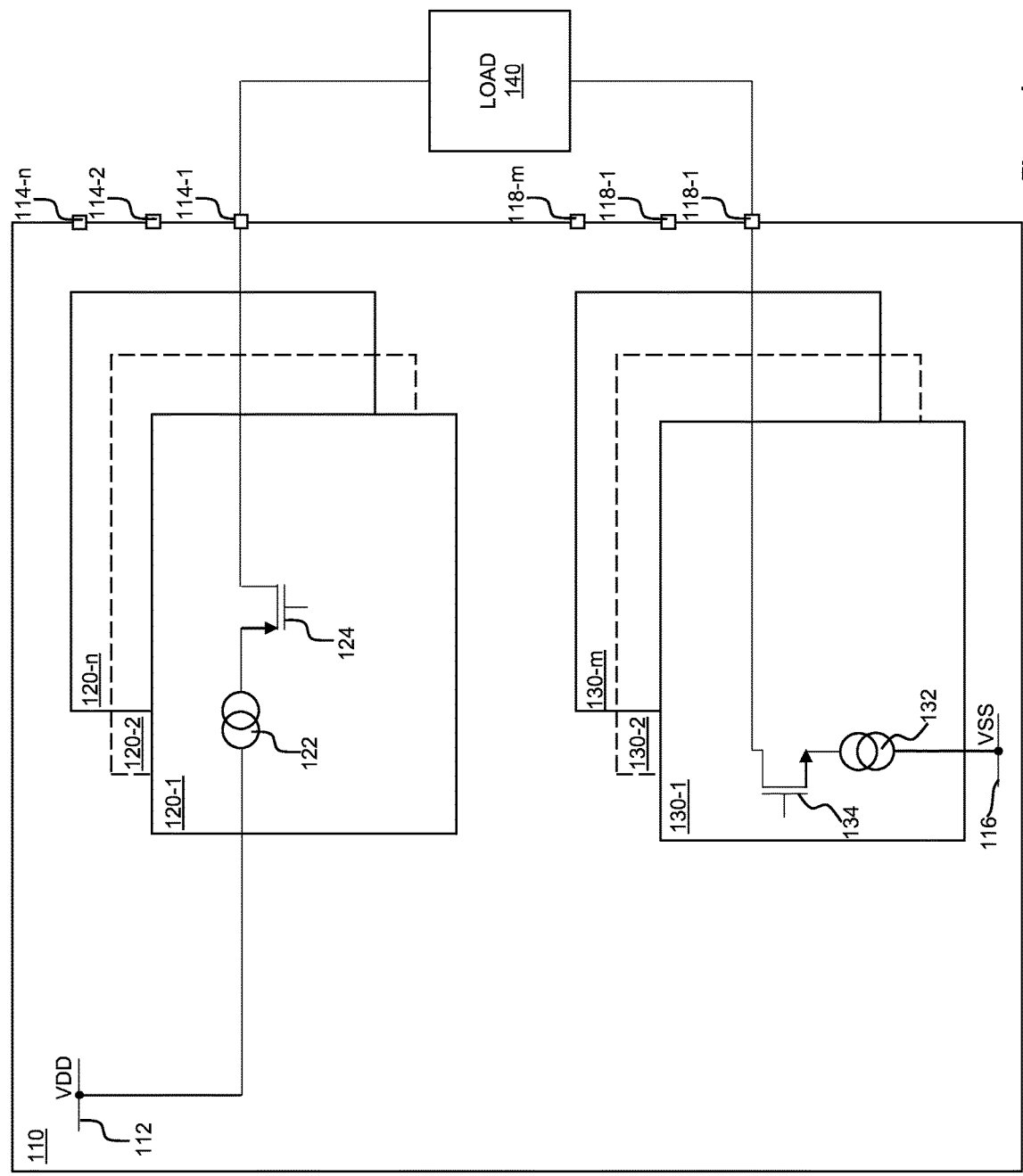
FIG. 1 is a schematic diagram illustrating driver circuitry having a plurality of current sources for driving a load.

Referring first to FIG. 1, driver circuitry for driving a load is shown generally at 100. The driver circuitry 100 includes an integrated circuit (IC) 110 having one or more selectively operable current control subsystems. In the illustrated example the one or more current control subsystems include one or more selectively operable current source subsystems 120-1, 120-2, 120-n and one or more selectively operable current sink subsystems 130-1, 120-2, 130-m which are configured to drive a load 140 that is coupled to one or more of the current source subsystems 120-1-120-n and one or more of the current sink subsystems 130-1-130-m.

In the illustrated example three current source and current sink subsystems are shown, but it is to be appreciated that the IC 110 may include more (e.g. four, five or more), or fewer (e.g. one or two) current source or current sink subsystems. Further, the number of current source subsystems need not be equal to the number of current sink subsystems (i.e. n is not necessarily equal to m). Instead, the circuitry 100 may include more current sink subsystems than current source subsystems, or vice versa.

Each current source subsystem 120-1-120-n is coupled to a supply voltage rail 112 of the IC 110, which provides a supply voltage VDD to the current source subsystems 120-1-120-n. Each current source subsystem 120-1-120-n includes a current source 122 and a controllable switch device 124 (e.g. a MOSFET) which can be actuated in response to a control signal so as to selectively couple the current source 122 to the load 140. (For clarity, in FIG. 1 only the current source subsystem 110-1 is shown as being coupled to the supply voltage rail 112 and having a current source 122 and controllable switch device 124, but it is to be understood that each of the current source subsystems 110-1-110-$n$ is coupled to the supply voltage rail 112 and includes a current source 122 and controllable switch device 124).

An output of each current source subsystem 110-1-110-$n$ is coupled to a respective current source output terminal (e.g. a pin, pad, ball or the like) 114-1-114-$n$ of the IC 110. Each of the current source output terminals 114-1-114-$n$ is coupled to a current source input terminal of the load 140 (though for clarity only the output terminal 114-1 is shown as being coupled to the load 140 in FIG. 1). The load 140 may be provided with a plurality of current source input terminals, in which case each output terminal 114-1-114-$n$ may be coupled to a different current source input terminal of the load. Alternatively the load may be provided with only a single current source input terminal, in which case each current source output terminal 114-1-114-$n$ may be coupled to the single current source input terminal of the load 140. Because the current source output terminals 114-1-114-$n$ are configured to be coupled to the load 140, the current source output terminals 114-1-114-$n$ may also be referred to as "load terminals" of the current source subsystems 120-1-120-$n$.

Each current sink subsystem 120-1-120-$m$ is coupled to a reference voltage rail 116 of the IC 110, which provides a reference voltage VSS (e.g. 0V) to the current sink subsystems 130-1-130-$m$. Each current sink subsystem 130-1-130-$m$ includes a current sink 132 and a controllable switch device 134 (e.g. a MOSFET) which can be actuated in response to a control signal to selectively couple the current sink 132 to the reference voltage rail 116 so as to selectively couple the current sink 132 to the load 140. (For clarity, in FIG. 1 only the current sink subsystem 130-1 is shown as being coupled to the reference voltage rail 116 and having a current sink 132 and controllable switch device 134, but it is to be understood that each of the current sink subsystems 130-1-130-3 is coupled to the reference voltage rail 116 and includes a current sink 132 and a controllable switch device 134).

An input of each current sink subsystem 130-1-130-$m$ is coupled to a respective current sink input terminal 118-1-118-$m$ of the IC 110. Each of the current sink input terminals 118-1-118-$m$ is coupled to a current sink output terminal of the load 140 (though for clarity only the current sink input terminal 118-1 is shown as being coupled to the load 140 in FIG. 1). The load 140 may be provided with a plurality of current sink output terminals, in which case each current sink input terminal 118-1-118-$m$ may be coupled to a different current sink output terminal of the load 140. Alternatively the load may be provided with only a single current sink output terminal, in which case each current sink input terminal 118-1-118-$m$ may be coupled to the single current sink output terminal of the load 140. Because the current sink input terminals 118-1-114-$m$ are configured to be coupled to the load 140, the current sink input terminals 118-1-118-$m$ may also be referred to as "load terminals" of the current sink subsystems 130-1-130-$m$.

The load 140 may comprise, for example, a current-driven transducer or an array of such transducers. For example, the load 140 may comprise an ultrasonic transducer or array of ultrasonic transducers, an LED or array of LEDs, or some other current-drive transducer or array of current-driven transducers.

By issuing appropriate control signals to the controllable switch devices 124 of the current source subsystems 120-1-120-$n$ and to the controllable switch devices 134 of the current sink subsystems 130-1-130-$m$, one or more of the current sources 122 or current sinks 132 can be selected to supply current to drive the load 140. (It is to be noted that FIG. 1 shows current source subsystems 120-1-120-$n$ including current sources 122 and current sink subsystems including current sinks 132, for the purposes of illustrating the possibility of driving the load with a current source or a current sink. However, as will be appreciated by those skilled in the art, in a practical implementation of the driver circuitry 100, a current source 122 and a current sink 132 will not be connected in series.)

To help detect faults or malfunctions in the circuitry 100, and to facilitate remedial action for such faults or malfunctions, it may be desirable to be able to test the circuitry 100 prior to or during use to detect faults or malfunctions such as short circuits between the current source output terminals 114-1-114-$n$ or the current sink input terminals 118-1-118-$m$ and ground or VDD, short circuits between one or more of the current source output terminals 114-1-114-$n$ and one or more of the current sink input terminals 118-1-118-$m$, and faults or malfunctions in internal switch devices of the current source subsystems 120-1-120-$n$ and the current sink subsystems 130-1-130-$n$.

Figure 2:
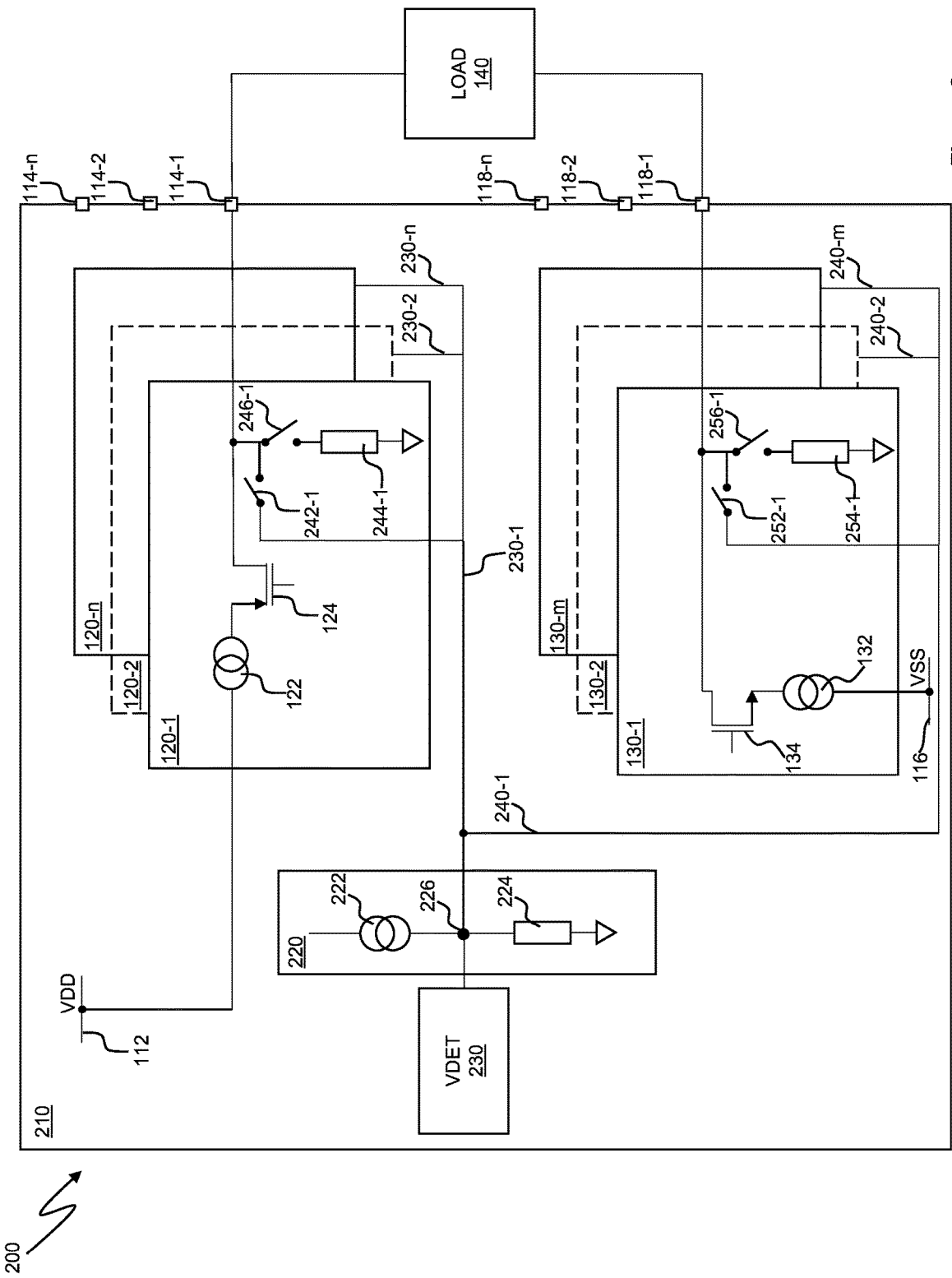
FIG. 2 is a schematic diagram illustrating self-test circuitry for testing a current source of the driver circuitry of FIG. 1 for short circuits a supply rail or a reference voltage rail that provide a reference voltage such as ground, and for detecting short circuits between current sources.

FIG. 2 is a schematic representation of driver circuitry of the kind shown in FIG. 1 with self-test circuitry for testing for short circuits to VDD and VSS (e.g. ground), and short circuits between one or more of the current source output terminals 114-1-114-$n$ and one or more of the current sink input terminals 118-1-118-$m$.

Elements that are common to FIGS. 1 and 2 are denoted by common reference numerals and will not be described in detail again here for the sake of clarity and brevity.

The circuitry shown generally at 200 in FIG. 2 includes an integrated circuit (IC) 210 comprising one or more current source subsystems 120-1-120-$n$ and one or more current sink subsystems 130-1-130-$m$, for driving a load 140 as described above with reference to FIG. 1.

The IC 210 also includes test voltage source circuitry 220, which in the example illustrated in FIG. 2 comprises a current source 222 coupled in series with a test voltage source resistance 224 such that, in use of the test voltage source circuitry 220, a test voltage of known value develops at a test node 226.

The IC 210 further includes voltage detection circuitry 230, having an input coupled to the test node 226. The voltage detection circuitry 230 is configured to detect a voltage at the test node 226 and to output an alert signal if the voltage detected at the test node does not correspond to an expected voltage.

The test voltage source circuitry 220, the test node 226 and the voltage detection circuitry 230 are common to all of the current source subsystems 120-1-120-$n$ and to all of the current sink subsystems 130-1-130-$m$, such that the test voltage source circuitry 220 and the voltage detection circuitry 230 can be used to detect fault conditions in all of the current source subsystems 120-1-120-$n$ and all of the current sink subsystems 130-1-130-$m$, as will be described in further detail below.

The IC 210 also includes first signal paths 230-1, 230-2, 230-$n$, each of which is configured to selectively couple the test node 226 to a respective current source output terminal 114-1-114-*n*. Thus the IC 210 includes a first signal path for each current source output terminal 114-1, 114-*n*.

Each first signal path 230-1, 230-2, 230-*n* includes a first controllable coupling switch 242-1-242-*n* such as a transistor that can be opened or closed in response to an appropriate control signal issued by, e.g., a controller (not shown in FIG. 2). When the first controllable coupling switch 242-1-242-*n* of a first signal path 230-1-230-*n* is closed, the test node 226 is coupled to the relevant one of the current source output terminals 114-1, 114-*n*, whereas when the first controllable coupling switch 242-1-242-*n* of a first signal path 230-1-230-*n* is open, the test node 226 is decoupled from the relevant one of the current source output terminals 114-1, 114-*n*. Thus each first signal path 230-1-230-*n* is configured to selectively couple the test node 226 to a respective current source output terminal 114-1-114-*n*.

The IC 210 also includes second signal paths 240-1, 240-2, 240-*n*, each of which is configured to selectively couple the test node 226 to a respective current sink input terminal 118-1-118-*m*. Thus the IC 210 includes a second signal path for each current sink input terminal 118-1, 118-*m*.

Each second signal path 240-1, 240-2, 240-*n* includes a second controllable coupling switch 252-1-252-*m* such as a transistor that can be opened or closed in response to an appropriate control signal issued by, e.g., a controller (not shown in FIG. 2). When the second controllable coupling switch 252-1-252-*m* of a second signal path 240-1-240-*n* is closed, the test node 226 is coupled to the relevant one of the current sink input terminals 118-1, 118-*m*, whereas when the second controllable coupling switch 252-1-252-*m* of a second signal path 240-1-240-*n* is open, the test node 226 is decoupled from the relevant one of the current sink output terminals 118-1, 118-*m*. Thus each second signal path 240-1-240-*m* is configured to selectively couple the test node 226 to a respective current sink input terminal 118-1-118-*m*.

The IC 210 further includes a first resistance 244-1-244-*n* for each current source subsystem 120-1-120-*n*. A resistance value of each first resistance 244-1-244-*n* may be equal to a resistance value of the test voltage source resistance 224 of the voltage source circuitry 220.

Each first resistance 244-1-244-*n* is coupled between VSS (e.g. ground) and the relevant one of the first signal paths 230-1-230-*n* via a respective third controllable coupling switch 246-1-246-*n* such as a transistor that can be opened or closed in response to an appropriate control signal issued by, e.g., a controller (not shown in FIG. 2). For example, a first resistance 244-1 associated with the current source subsystem 120-1 is coupled between the first signal path 230-1 associated with the current source subsystem 120-1 and VSS via a third controllable coupling switch 246-1.

Thus, each first resistance 244-1-244-*n* can be selectively coupled to a respective one of the first signal paths 230-1-230-*n*.

The IC 210 further includes a second resistance 254-1-254-*m* for each current sink subsystem 130-1-130-*m*. A resistance value of each second resistance 254-1-254-*m* may be equal to a resistance value of the test voltage source resistance 224 of the voltage source circuitry 220.

Each second resistance 254-1-254-*m* is coupled between VSS (e.g. ground) and the relevant one of the second signal paths 240-1-240-*m* via a respective fourth controllable coupling switch 256-1-256-*m* such as a transistor that can be opened or closed in response to an appropriate control signal issued by, e.g., a controller (not shown in FIG. 2). For example, a second resistance 254-1 associated with the current sink subsystem 130-1 is coupled between the second signal path 240-1 associated with the current sink subsystem 130-1 and VSS via a fourth controllable coupling switch 256-1.

Thus, each second resistance 254-1-254-*m* can be selectively coupled to a respective one of the second signal paths 240-1-240-*m*.

The self-test circuitry of the IC 210 can be used for testing for short circuits to VDD and VSS (e.g. ground), and for short circuits between one or more of the current source output terminals 114-1-114-*n* and one or more of the current sink input terminals 118-1-118-*m*, as will now be described with reference to FIGS. 3-5.

Figure 3:
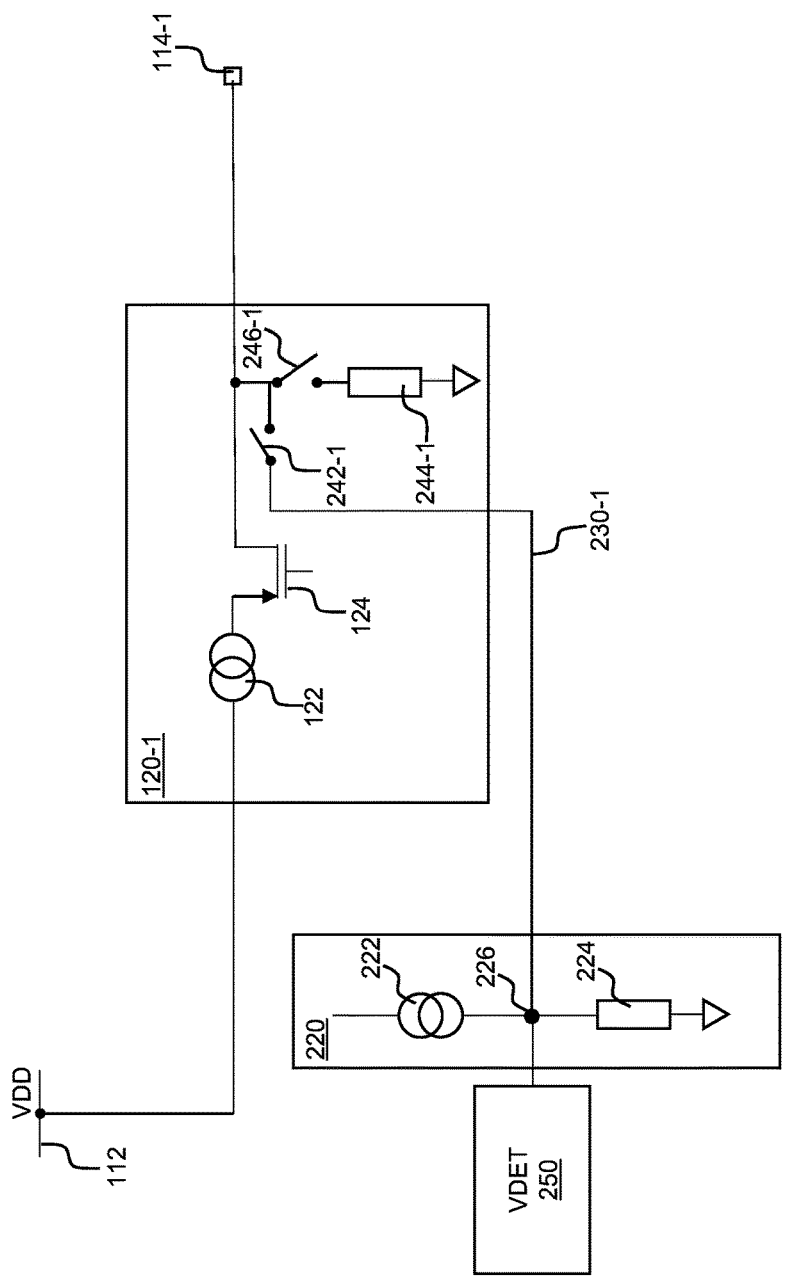
FIG. 3 illustrates the use of the self-test circuitry for detecting high-side short circuits to a supply rail or to ground.

FIG. 3 illustrates the use of the self-test circuitry of the IC 210 for detecting high-side short circuits to the supply rail 112 or to ground. For simplicity and clarity FIG. 3 shows only the test circuitry that is relevant for testing one of the current source subsystems 120-1 for such short circuits, but it will be apparent to those of ordinary skill in the art that the configuration of the circuitry and the process described below can also be used to test any of the current source subsystems 120-1-120-*n* for short circuits of the kind described above.

In use of the self-test circuitry of the IC 210 for detecting high-side short circuits to the supply rail 112 or to ground, a control signal is issued to the controllable switch device 124 (e.g. by a controller, not shown in the drawings) to cause the controllable switch device 124 to open, thereby decoupling the current source 122 from the load 140, thus disabling the current source subsystem 120-1. A control signal is also issued to the first controllable coupling switch 242-1 (e.g. by the controller) to cause that switch to close, thereby coupling the test node 226 to the current source output terminal 114-1 of the current source subsystem 120-1. A further control signal is issued to the third controllable coupling switch 246-1 (e.g. by the controller) to cause the third controllable coupling switch 246-1 to open, thereby decoupling the first resistance 244-1 from the first signal path 230-1.

The current source 222 of the voltage source generator circuitry 220 is enabled and outputs a current which causes a known test voltage (defined by the current output by the current source 222 and the value of the test voltage source resistance 224) to develop at the test node 226. The voltage detection circuitry 250 detects the voltage at the test node 226.

In normal operation of the circuitry 200 (i.e. in the absence of any faults or malfunctions), the voltage detected by the voltage detection circuitry 250 should be substantially equal to the known test voltage, because the current output terminal 114-1 of the current source subsystem 120-1 is coupled only to the test node 226. Thus, if the voltage detection circuitry 250 detects a voltage that is different from the known test voltage this may be indicative of a fault condition, and the voltage detection circuitry 250 can output an appropriate fault signal, e.g. to the controller.

For example, if the voltage detected by the voltage detection circuitry 250 is equal or close to (e.g. within some threshold of) the supply voltage VDD, this may be indicative of a high-side short circuit between the current source output terminal 114-1 and the supply voltage rail 112, and the voltage detection circuitry 250 may output a signal indicating detection of a short circuit to VDD, e.g. to the controller.

If the voltage detected by the voltage detection circuitry 250 is equal or close to (e.g. within some threshold of) the reference voltage VSS (which may be, for example, 0V), this may be indicative of a short circuit between the current source output terminal 114-1 and the reference voltage rail 116, and the voltage detection circuitry 250 may output a signal indicating detection of a high-side short circuit to VSS, e.g. to the controller.

Figure 4:
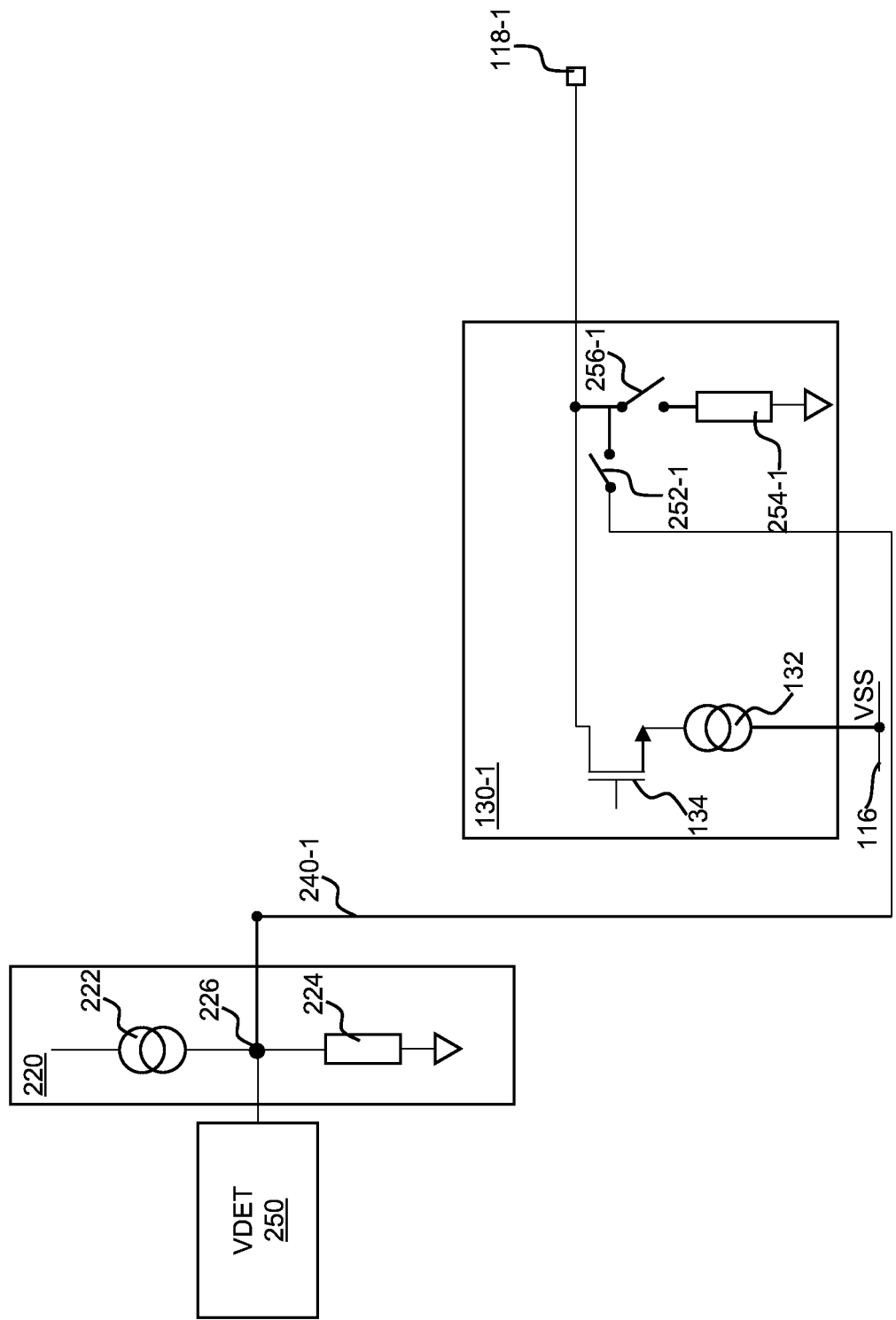
FIG. 4 illustrates the use of the self-test circuitry for detecting low-side short circuits to a supply rail or to ground.

FIG. 4 illustrates the use of the self-test circuitry of the IC 210 for detecting low-side short circuits to a reference voltage supply rail that supplies a reference voltage (e.g. 0V or ground). Again, for simplicity and clarity FIG. 4 shows only the test circuitry that is relevant for testing one of the current sink subsystems 130-1 for such short circuits, but it will be apparent to those of ordinary skill in the art that the configuration of the circuitry and the process described below can also be used to test any of the current sink subsystems 130-1-130-m for short circuits of the kind described above.

In use of the self-test circuitry of the IC 210 for detecting low-side short circuits to the reference voltage rail 116, a control signal is issued to the controllable switch device 134 (e.g. by a controller, not shown in the drawings) to cause the controllable switch device 134 to open, thereby decoupling the current sink 132 from the load 140, thus disabling the current sink subsystem 130-1. A control signal is also issued to the second controllable coupling switch 252-1 (e.g. by the controller) to cause that switch to close, thereby coupling the test node 226 to the current sink input terminal 118-1 of the current sink subsystem 130-1. A further control signal is issued to the fourth controllable coupling switch 256-1 (e.g. by the controller) to cause the fourth controllable coupling switch 256-1 to open, thereby decoupling the second resistance 254-1 from the second signal path 240-1.

The current source 222 of the voltage source generator 220 is enabled and outputs a current which causes a known test voltage (defined by the current output by the current source 222 and the value of the test voltage source resistance 224) to develop at the test node 226. The voltage detection circuitry 250 detects the voltage at the test node.

As before, in normal operation of the circuitry 200 (i.e. in the absence of any faults or malfunctions), the voltage detected by the voltage detection circuitry 250 should be substantially equal to the known test voltage, because the current input terminal 118-1 of the current sink subsystem 130-1 is coupled only to the test node 226. Thus, if the voltage detection circuitry 250 detects a voltage that is different from the known test voltage this may be indicative of a fault condition, and the voltage detection circuitry 250 may output an appropriate fault signal, e.g. to the controller.

For example, if the voltage detected by the voltage detection circuitry 250 is equal or close to (e.g. within some threshold of) the supply voltage VDD, this may be indicative of a short circuit between the current sink input terminal 118-1 and the supply voltage rail 112, and the voltage detection circuitry 250 may output a signal indicating detection of a low-side short circuit to VDD, e.g. to the controller.

If the voltage detected by the voltage detection circuitry 250 is equal or close to (e.g. within some threshold of) the reference voltage VSS, this may be indicative of a short circuit between the current sink input terminal 118-1 and the reference voltage rail 116, and the voltage detection circuitry 250 may output a signal indicating detection of a low-side short circuit to VSS, e.g. to the controller.

Figure 5:
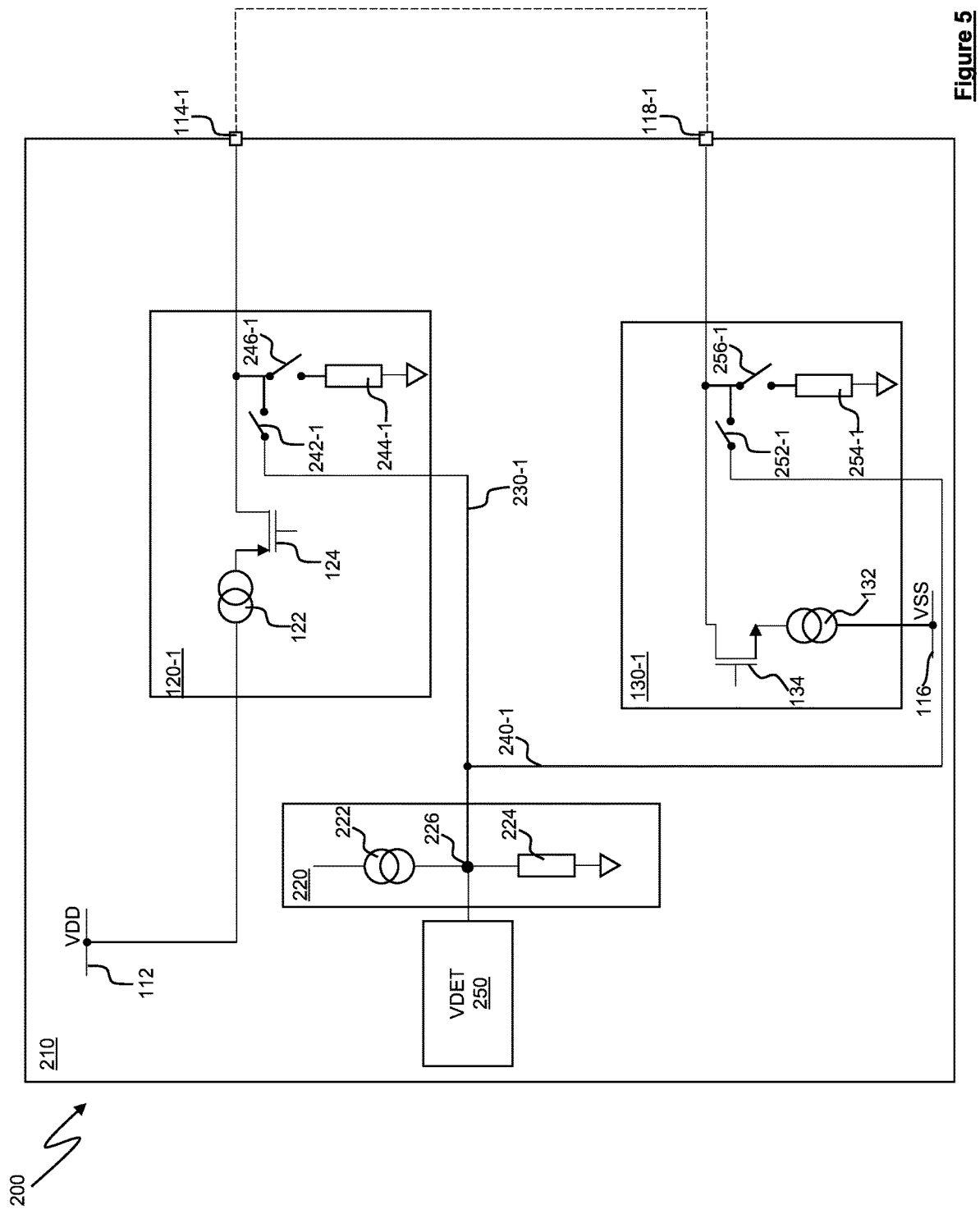
FIG. 5 illustrates the use of the self-test circuitry for detecting short circuits between current sources.

FIG. 5 illustrates the use of the self-test circuitry of the IC 210 for detecting short circuits between current sources. For simplicity and clarity FIG. 5 shows only the test circuitry that is relevant for detecting a short circuit between one of the current source subsystems 120-1 and one of the current sink subsystems 130-1 but it will be apparent to those of ordinary skill in the art that the configuration of the circuitry and the process described below can also be used to detect such short circuits between any of the current source subsystems 120-1-120-n and any of the current sink subsystems 130-1-130-m.

In use of the self-test circuitry of the IC 210 for detecting such short circuits, control signals are issued to the controllable switch devices 124, 134 (e.g. by a controller, not shown in the drawings) to cause them to open, thereby decoupling the current source 122 and the current sink 132 from the load 140, thus disabling the current source subsystem 120-1 and the current sink subsystem 130-1.

A control signal is also issued to the first controllable coupling switch 242-1 (e.g. by the controller) to cause that switch to close, thereby coupling the test node 226 to the current source output terminal 114-1 of the current source subsystem 120-1. A further control signal is issued to the second controllable coupling switch 252-1 (e.g. by the controller) to cause that switch to open, thereby decoupling the test node 226 from the current source input terminal 118-1 of the current source subsystem 120-1. A further control signal is issued to the fourth controllable coupling switch 256-1 (e.g. by the controller) to cause the fourth controllable coupling switch 256-1 to close, thereby coupling the second resistance 254-1 to the second signal path 240-1.

The current source 222 of the voltage source generator 220 is enabled and outputs a current which causes a known test voltage (defined by the current output by the current source 222 and the value of the test voltage source resistance 224) to develop at the test node 226. The voltage detection circuitry 250 detects the voltage at the test node.

As before, in normal operation of the circuitry 200 (i.e. in the absence of any faults or malfunctions), the voltage detected by the voltage detection circuitry 250 should be substantially equal to the known test voltage, because the current output terminal 114-1 of the current source subsystem 120-1 is coupled only to the test node 226. Thus, if the voltage detection circuitry 250 detects a voltage that is different from the known test voltage this may be indicative of a fault condition, and the voltage detection circuitry may output an appropriate fault signal, e.g. to the controller.

In the event of a short circuit between the current output terminal 114-1 and the current input terminal 118-1 (as indicated by the dashed line in FIG. 5), a current path from the test node 226 to ground, via the second resistance 254-1, will exist. In such circumstances, instead of being connected in series with the test voltage source resistance 224, the current source 222 is connected in series with the parallel combination of the test voltage source resistance 224 and the second resistance 254-1, which results in a reduction in the voltage that develops at the test node 226 when the current source 222 is enabled. Thus, if the voltage detection circuitry 250 detects a voltage that is less than the known test voltage this may be indicative of a fault condition, and the voltage detection circuitry 250 may output an appropriate fault signal, e.g. to the controller.

For example, in in normal operation of the circuitry 200 assume that the resistance value of the test voltage source resistance is R1, and the current source 222 outputs a current I. The known test voltage that develops at the test node is equal to I.R1.

If the resistance value R2 of the second resistance 254-1 is equal to the resistance value R1 (i.e. R1=R2=R) of the test voltage source resistance 224, the total effective resistance value RTOT of the parallel combination of the test voltage source resistance 224 and the second resistance 254-1 in the event of a short circuit between the current output terminal 114-1 and the current input terminal 118-1 is defined by $$RTOT=R1.R2/R1+R2=R/2,$$

Thus the voltage that develops at the test node 266 In the case of a short circuit between the current output terminal 114-1 and the current input terminal 118-1 is approximately equal to IR/2, where I is the current output by the current source 222. (As will be appreciated by those or ordinary skill in the art, the resistance values of the resistances 224, 254-1 are unlikely to be exactly equal, and thus the voltage that develops at the test node is unlikely to be exactly equal to IR/2).

Accordingly, if the voltage detector circuitry 250 detects a voltage equal or close to (e.g. within some threshold of) IR/2 this may be indicative of a fault condition, and the voltage detection circuitry 250 may output an appropriate fault signal, e.g. to the controller.

As will be appreciated by those of ordinary skill in the art, the same test for short circuitry between the current sink input terminal 118-1 and the current source output terminal 114-1 can be performed by closing the second controllable coupling switch 252-1 and the third controllable coupling switch 246-1 and opening the first controllable coupling switch 142-1 and the fourth controllable coupling switch 256-1.

In this configuration, in the event of a short circuit between the current sink input terminal 118-1 and the current source output terminal 114-1, a current path will exist from the test node 226 to ground via the third controllable coupling switch 246-1 and the first resistance 244-1.

In such circumstances, assuming that the resistance value of the first resistance 244-1 is equal to the resistance value of the of the test voltage source resistance 224, then the voltage at the test node 226 will again be approximately equal to IR/2, and if the voltage detector circuitry 250 detects a voltage equal or close to (e.g. within some threshold of) IR/2 this may be indicative of a fault condition. The voltage detection circuitry 250 may thus output an appropriate fault signal, e.g. to the controller.

Figure 6:
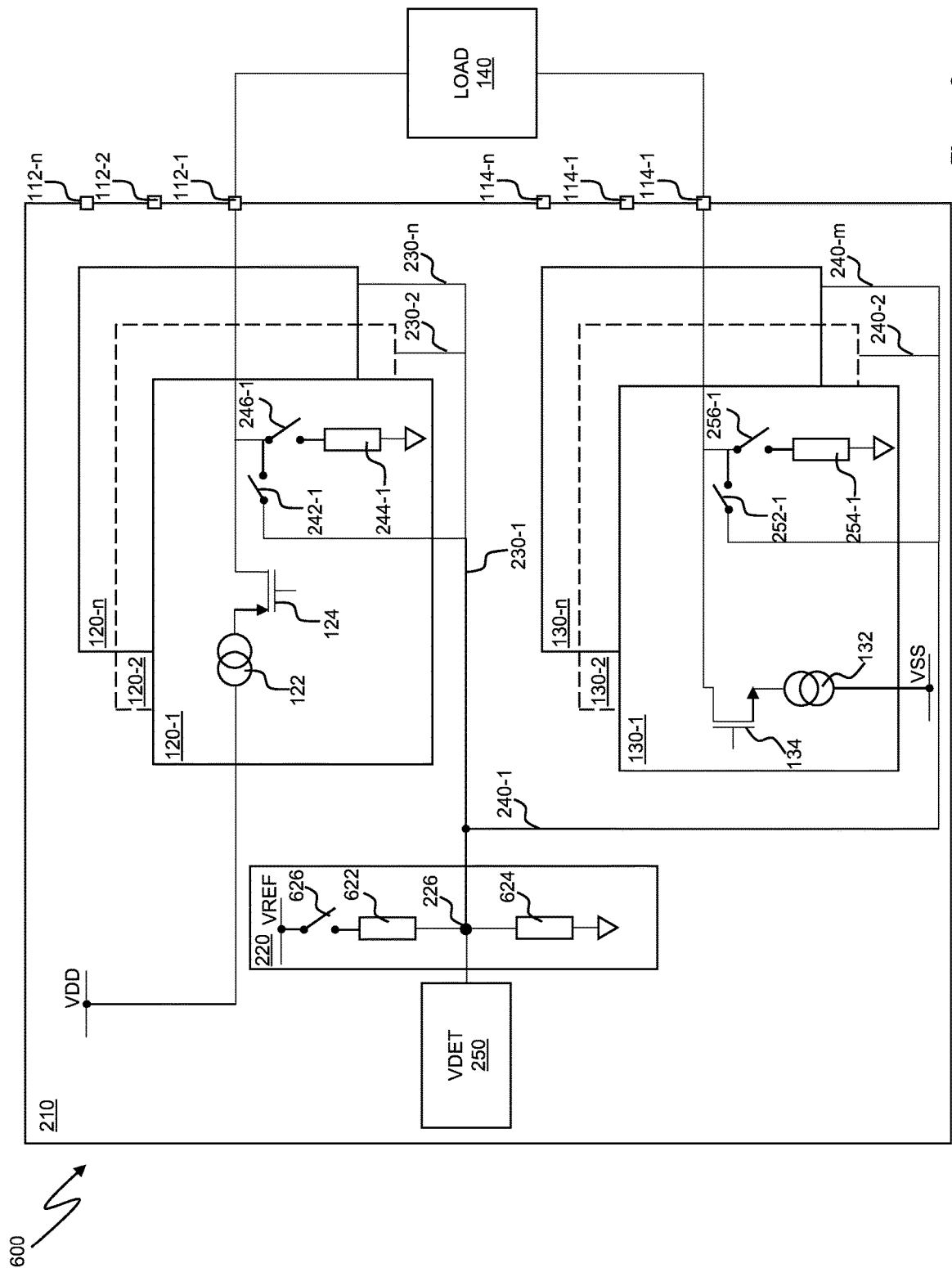
FIG. 6 is a schematic diagram illustrating alternative self-test circuitry for testing a current source of the driver circuitry of FIG. 1 for short circuits to ground or a supply rail, and for detecting short circuits between current sources.

FIG. 6 is a schematic diagram illustrating alternative self-test circuitry 600. The alternative self-test circuitry of FIG. 6 is similar to the self-circuitry of FIG. 2, and thus elements that are common to FIGS. 2 and 6 are denoted by common reference numerals and will not be described in detail again here for the sake of clarity and brevity.

The self-test circuitry 600 of FIG. 6 differs from the self-test circuitry 200 of FIG. 2 in that the test voltage source circuitry 220 comprises a resistive voltage divider comprising first and second voltage divider resistances 622, 624 connected in series between a reference voltage VREF and VSS, via a controllable switch device 626 (e.g. a transistor) that is coupled between the first voltage divider resistance 622 and the reference voltage VREF. A node between the first voltage divider resistance 622 and the second voltage divider resistance 624 provides the measurement node 226. A resistance value RVD1 of the first voltage divider resistance 622 may be equal to a resistance value RVD2 of the second voltage divider resistance 624, and the resistance values R1, R2 of the first and second resistances 244-1, 254-1 associated with the current source subsystem 120-1 and the current sink subsystem 130-1 respectively may be equal to the resistance value of the first and second voltage divider resistances (i.e. RVD1=RVD2=R1=R2).

Thus, in normal operation of the circuitry 600 (i.e. in the absence of any short circuits) the voltage that develops at the test node 226 will be approximately VREF/2.

In use of the self-test circuitry 600 of FIG. 6, testing for high-side and low-side short circuits to VSS and VDD are performed in the manner described above with respect to FIGS. 3 and 4, with the exception that instead of enabling the current source 222, the controllable switch 626 is closed to enable the voltage divider made up of the two resistances 622, 624 so that the known test voltage develops at the measurement node.

Similarly, testing for short circuits between one or more of the current source output terminals 1142-1-114-*n* and one or more of the current sink input terminals 118-1-118-*m* is performed in the manner described above with reference to FIG. 5. In the event of a short circuit between a current source output terminal 114-1-114-*n* and a current sink input terminal 118-1-118-*n* as described above with reference to FIG. 5, a current path to VSS exists via the fourth controllable coupling switch 256-1 and the second resistance 254-1. In such circumstances, a resistive voltage divider is formed from the resistance 622 and the parallel combination of the resistances 624 and 254-1.

Assuming that the resistance values of the resistances 622, 624 and 254-1 are (approximately) equal, the effective value of the parallel combination of the resistances 624 and 254-1 is approximately equal to R/2, as explained above.

Thus, the voltage that develops at the test node 226 in the event of a short circuit between a current source output terminal 112-1-112-*n* and a current sink input terminal 114-1-114-*n* is (approximately) equal to:

$$VREF \cdot (R/2)/(R+R/2)=VREF/3.$$

Accordingly, if the voltage detector circuitry 250 detects a voltage equal or close to (e.g. within some threshold of) VREF/3 this may be indicative of a fault condition, and the voltage detection circuitry 250 may output an appropriate fault signal, e.g. to the controller.

The schematic diagrams of FIGS. 1-6 show the resistances 244-1-244-*n* and the controllable switching devices 242-1-242-*n*, 246-1-246-*n* as being provided within the current source subsystems 120-1-120-*n*, but it will be appreciated that these elements could equally be provided outside of the current source subsystems 120-1-120-*n*.

Similarly, although the schematic diagrams of FIGS. 1-6 show the resistances 254-1-254-*m* and the controllable switching devices 252-1-252-*n*, 256-1-256-*n* as being provided within the current sink subsystems 130-1-130-*m*, it will be appreciated that these elements could equally be provided outside of the current sink subsystems 130-1-130-*m*.

Figure 7:
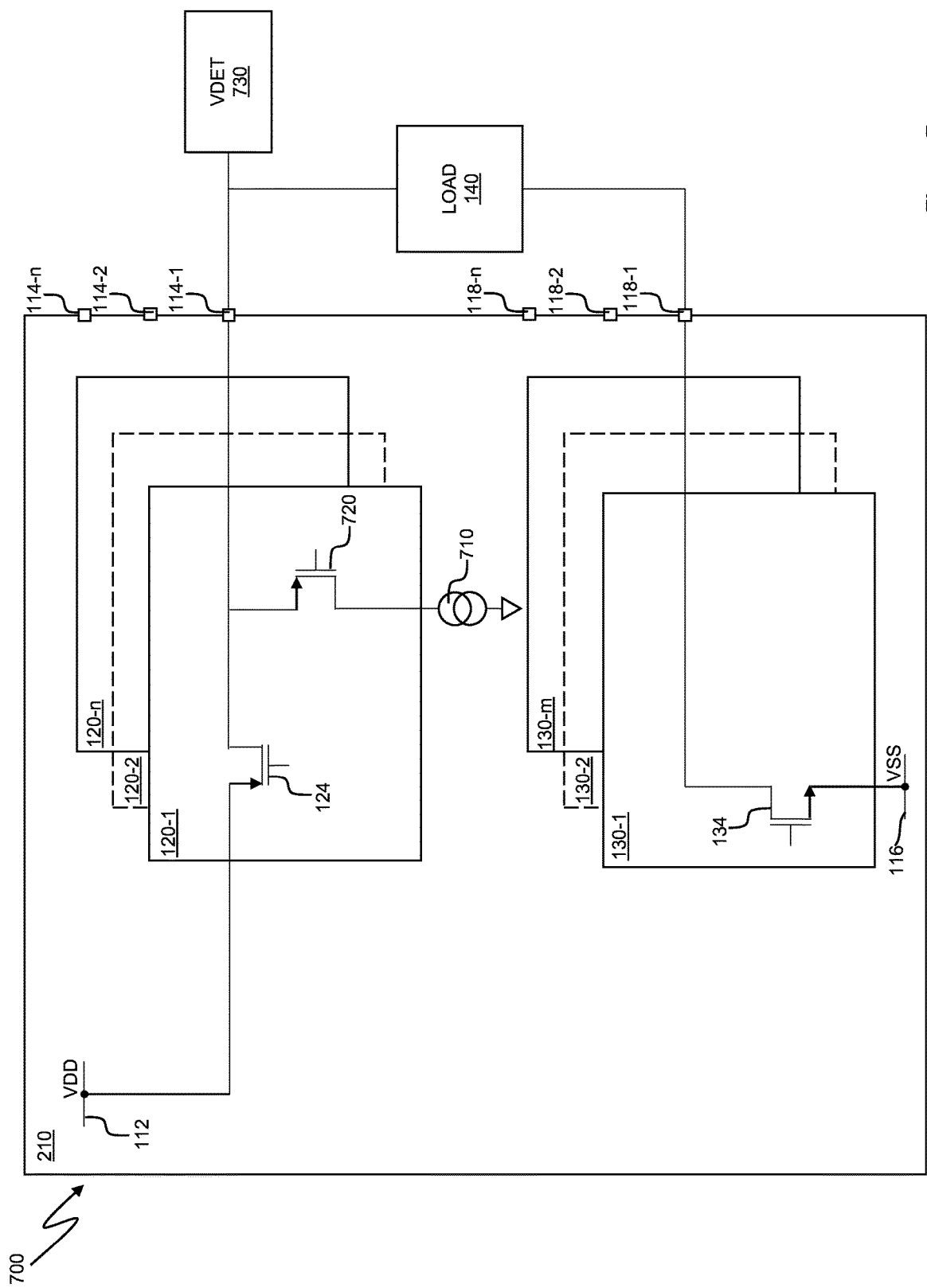
FIG. 7 is a schematic diagram illustrating self-test circuitry for testing a controllable switch device of a current source of the driver circuitry of FIG. 1.

FIG. 7 is a schematic diagram illustrating self-test circuitry that may be provided for testing a controllable switch device 124 of a current source subsystem 120-1-120-*n* in driver circuitry of the kind described above with reference to FIG. 1. The self-test circuitry (shown generally at 700 in FIG. 7) may be provided in addition to the self-test circuitry 200 described above with reference to FIGS. 2-6. Alternatively, the self-test circuitry shown in FIG. 7 may be provided independently of the self-test circuitry 200 of FIGS. 2-6.

As described above, each current source subsystem 120-1-120-*n* may include a controllable switch device 124 which can be either closed or opened in response to appropriate control signals from a controller, in order to enable or disable the current source subsystem 120-1-120-*n*.

The self-test circuitry illustrated in FIG. 7 is provided in order to test whether the controllable switch device 124 of a current source subsystem 120-1 is operating correctly, and includes a small (e.g. 1 mA) current sink 710 that can be selectively coupled to the output terminal 114-1 of the current source subsystem 120-1, via a second controllable switch device 720 such as a transistor. In some embodiments a separate current sink 710 and a separate controllable switch device 720 may be provided for each current source subsystem 120-1-120-*n*. Alternatively, only a single current sink 710 may be provided, with additional switching or multiplexer circuitry being provided in permit the current sink 710 to be coupled to the output terminal 114-1-110-*n* of any one of the current source subsystems 120-1-120-*n*.

The self-test circuitry 700 may be used during start-up of a host device incorporating the IC 210 to check for correct operation of the controllable switch devices 124 of the current source subsystems 120-1-120-*n*. In use of the self-test circuitry 700 to test the operation of a controllable switch device 124 of a current source subsystem 120-1-120-*n*, the controller issues control signals to cause the controllable switch device 134 of each of the current sink subsystems 130-1-130-*m*, to open, thereby disabling all of the current sink subsystems 130-1-130-*m*.

The controller then issues a control signal to the controllable switch device 124 of the current source subsystem 120-1-120-*n* under test to cause the controllable switch device 124 to close, thereby enabling the current source subsystem 120-1-120-*n* under test, and a voltage at the associated current source output terminal 114-1 is detected by voltage detection circuitry 730 (which may be the voltage detection circuitry 250 shown in FIGS. 2-6 if the self-test circuitry 700 is provided in addition to self-test circuitry 200, or may be separate voltage detection circuitry, even if the self-test circuitry 700 is provided in addition to self-test circuitry 200). If the controllable switch device is operating correctly the voltage detected by the voltage detection circuitry 730 will be close to VDD, since the voltage drop across the controllable switch device 124 will be small. In the event that the detected voltage is not close to VDD (e.g. the detected voltage is not within some threshold value based on VDD), this may be indicative of a fault in the controllable switch device 124 and the voltage detection circuitry 730 may output a signal (e.g. to the controller) indicative of a fault or error condition.

The controller then disables the current source subsystem 120-1-120-*n* under test, e.g. by issuing a control signal to cause the controllable switch device 124 to open, or by forcing a fault condition that has the effect of causing the controllable switch device 124 to open. If the controllable switch device is operating correctly the voltage detected by the voltage detection circuitry 730 will be close to VSS, since the voltage source output terminal 114-1-114-*n* associated with the current subsystem 120-1-120-*n* under test is no longer coupled to the supply voltage VDD. In the event that the detected voltage is not close to VSS (e.g. the detected voltage is greater than some threshold value based on VSS), this may be indicative of a fault in the controllable switch device 124 and the voltage detection circuitry 730 may output a signal (e.g. to the controller) indicative of a fault or error condition.

The schematic diagram of FIG. 7 shows the controllable switching devices 720 as being provided within the current source subsystems 120-1-120-*n*, but it will be appreciated that the controllable switching devices 720 could equally be provided outside of the current source subsystems 120-1-120-*n*.

Figure 8:
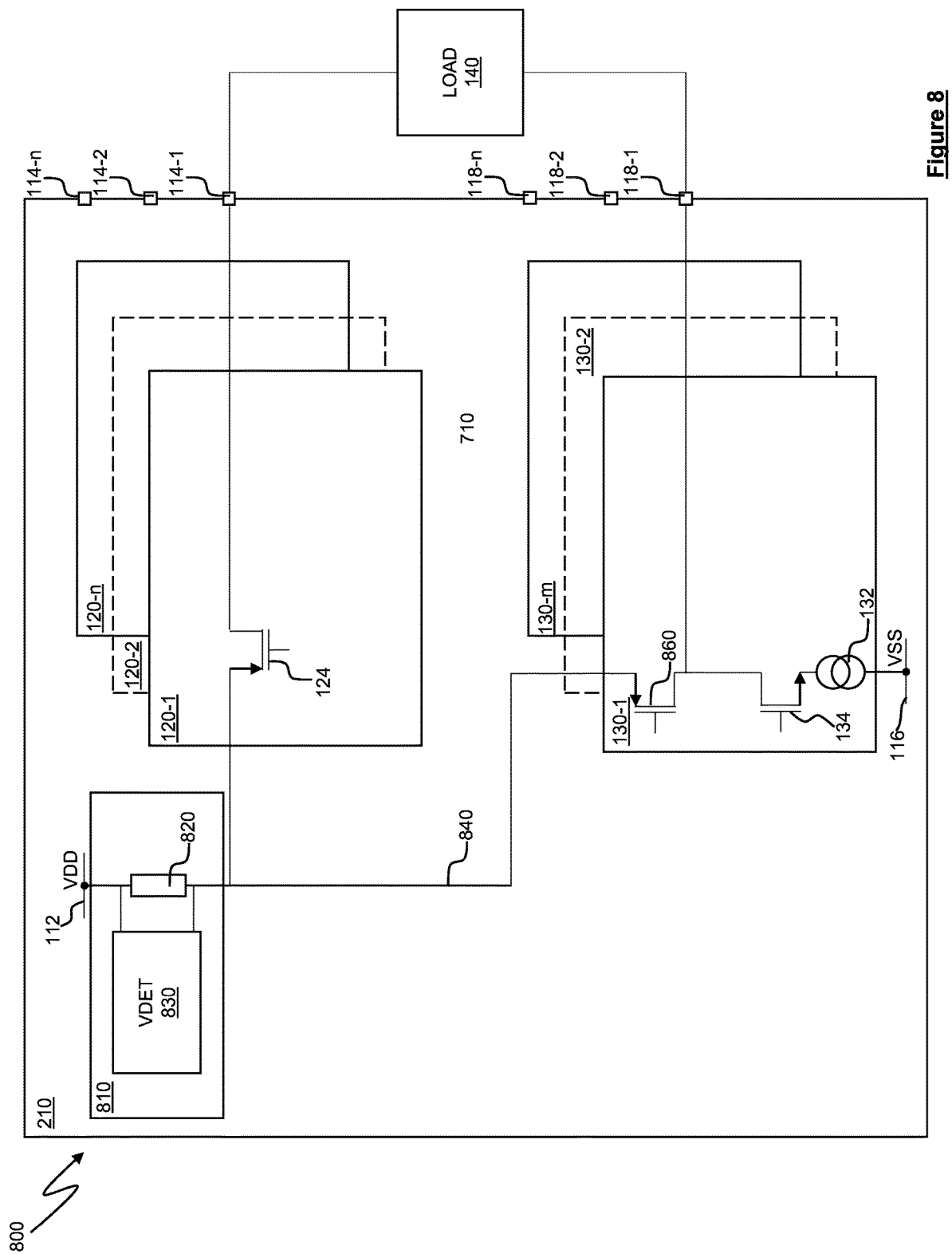
FIG. 8 is a schematic diagram illustrating self-test circuitry for testing a controllable switch device of a current sink of the driver circuitry of FIG. 1.

FIG. 8 is a schematic diagram illustrating self-test circuitry that may be provided for testing a controllable switch device 134 of a current sink subsystem 130-1-130-*m* in driver circuitry of the kind described above with reference to FIG. 1. The self-test circuitry (shown generally at 800 in FIG. 8) may be provided in addition to the self-test circuitry 200, 700 described above with reference to FIGS. 2-6 and 7. Alternatively, the self-test circuitry shown in FIG. 8 may be provided independently of the self-test circuitry 200, 700 of FIGS. 2-6 and 7.

As described above, each current sink subsystem 130-1-130-*m* may include a controllable switch device 134 which can be either closed or opened in response to appropriate control signals from a controller, in order to enable or disable the current sink subsystem 130-1-130-*m*.

The self-test circuitry 800 illustrated in FIG. 8 is provided in order to test whether the controllable switch device 134 of a current sink subsystem 130-1 is operating correctly, and includes current sense circuitry 810 for measuring current in a common conductive path 840 that is coupled to each of the current sink subsystems 130-1-130-*m*, as described below. The common conductive path 840 ensures that no current flows in the load 140 when a controllable switch device 134 is being tested.

The self-test circuitry 800 also includes a second controllable switch device (e.g. a transistor) 860 for each current sink subsystem 130-1-130-*m*. An output terminal (e.g. a drain terminal) of the second controllable switch device 860 is coupled to an input terminal (e.g. a drain terminal) of the controllable switch device 134. An input terminal (e.g. a source terminal) of the second controllable switch device 860 of each current sink subsystem 130-1-130-*m* is coupled to the common conductive path 840.

The self-test circuitry 800 may be used during start-up of a host device incorporating the IC 210 to check for correct operation of the controllable switch devices 134 of the current sink subsystems 130-1-130-*m*. Thus, in use of the self-test circuitry 800 all of the current source subsystems 120-1-120-*n* are disabled and all of the current sink subsystems 130-1-130-*m* are enabled by appropriate control signals (e.g. from the controller), which cause the controllable switch devices 134 of all of the current sink subsystems 130-1-130-*m* to close, to enable the current sink of each of the current sink subsystems 130-1-130-*m* to sink a current of a predetermined value Itest. e.g. 1 mA. Appropriate control signals are also issued to the second controllable switch device 860 of all of the current sink subsystems 130-1-130-*m* to cause them to close, thereby coupling the common conductive path 840 to all of the current sink subsystems 130-1-130-*m*.

The current in the common conductive path 840 is then measured by the current sense circuitry 810. If all of the controllable switch devices 134 are operating correctly, the measured current in the common conductive path should be (approximately) equal to the product of the number of current sink subsystems 130-1-130-*m* and the predetermined current value, i.e. m.Itest.

For example, if there are ten current sink subsystems and the predetermined current value is 1 mA then the measured current should be approximately equal to 10 mA. If the measured current does not correspond to the expected value (e.g. if it falls outside of some threshold value based on the expected current value) then the current sensing circuitry 810 can output a signal indicative of a fault or error to the controller.

A similar test may be performed with a higher predetermined current value, e.g. 51.2 mA. In this case, if there are ten current sinks the measured current should be approximately equal to 512 mA. If the measured current does not correspond to the expected value (e.g. if it falls outside of some threshold value based on the expected current value)

then the current sensing circuitry 810 can output a signal indicative of a fault or error to the controller.

The current sink subsystems **130-1-130-*m* can also be disabled, by issuing appropriate control signals to their controllable switch devices 134. With all of the second controllable switch devices 860 switched on, the measured current in the common conductive path 840 should be 0. Thus, in the event that the measured current is greater than zero when the current sink subsystems 130-1-130-*m* are be disabled the current sensing circuitry 810** can output a signal indicative of a fault or error to the controller.

In the event that a fault is detected by the combined tests described above, each current sink subsystem **130-1-130-*m* can subsequently (or alternatively) be tested individually, by disabling all of the current sink subsystems 130-1-130-*m* apart from the one under test and comparing the measured current in the common conductive path 840 to an expected current value when the current sink subsystem under test is enabled and when it is disabled, in the manner described above. If the current in the common conductive path 840 differs from the expected current value for one of the current sink subsystems 130-1-130-*m* then the current sensing circuitry 810 can output a signal indicative of a fault or error to the controller, thus enabling the current sink subsystem 130-1-130-*m* containing the faulty controllable switch device 134** to be identified.

By initially performing a test of all of the current sink subsystems **130-1-130-*m* simultaneously the need to test each current sink subsystem 130-1-130-*n*** individually can be avoided, as individual testing is only required if a fault is detected by the initial test.

As will be appreciated by those skilled in the art, the relatively low and relatively higher predetermined current values discussed above are merely examples, and any current value within an operational range of the circuitry 800 could be used to test the controllable switch devices 134.

The schematic diagram of FIG. 8 shows second controllable switching device 860 as being provided within the current sink subsystems **130-1-130-*m*, but it will be appreciated that the second controllable switching device 860 could equally be provided outside of the current sink subsystems 130-1-130-*m***.

The foregoing description refers to a controller that controls the operation of the controllable switch device 124, 134, **242-1-242-*n*, 246-1-246-*n*, 252-1-252-*m*, 254-1-254-*m*, 720 and 860. The controller may be, for example, a processor (e.g. a main or applications processor) of a host device that incorporates the IC 210, or a dedicated processor or processing circuitry associated with or integrated into the IC 210**.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device. The device could be a wearable device such as a smartwatch. The device could be a device with voice control or activation functionality such as a smart speaker. In some instances the device could be an accessory device such as a headset, headphones, earphones, earbuds or the like to be used with some other product. In some instances the device could be a gaming device such as a games console, or a virtual reality (VR) or augmented reality (AR) device such as a VR or AR headset, spectacles or the like.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog TM or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Self-test circuitry for a system that includes one or more current control subsystems, each current control subsystem having a load terminal for coupling the current control subsystem to a load, the self-test circuitry comprising:
a signal path associated with each current control subsystem, each signal path configured to selectively couple a measurement node to the load terminal of the current control subsystem, wherein the measurement node is common to all of the signal paths;
voltage detection circuitry; and
test voltage source circuitry configured to provide a test voltage to the measurement node, wherein the voltage detection circuitry is operable to output a signal indicative of a fault condition if a voltage detected at the measurement node differs from the test voltage when the measurement node is coupled to the load terminal and the load is decoupled from each of the current control subsystems.

2. Self-test circuitry according to claim 1 wherein the one or more current control subsystems comprise one or more current source subsystems and/or one or more current sink subsystems.

3. Self-test circuitry according to claim 2 further comprising current sink circuitry associated with a current source subsystem, the current sink circuitry being selectively couplable to the signal path associated with the current source subsystem, wherein the voltage detection circuitry is operable to output a signal indicative of a fault condition if a voltage detected at the load terminal of the current source subsystem differs from a first expected voltage when the current source subsystem is disabled or if the detected voltage differs from a second expected voltage when the current source subsystem is enabled.

4. Self-test circuitry according to claim 3 wherein the first expected voltage is based on a system reference voltage and wherein the second expected voltage is based on a system supply voltage.

5. Self-test circuitry according to claim 2 further comprising:
a common conductive path coupled to each of a plurality of current sink subsystems; and
current sensing circuitry configured to measure a current in the common conductive path,
wherein the current sensing circuitry is configured to output a signal indicative of a fault condition if the measured current in the common conductive path differs from a first expected current when the plurality of current sink subsystems are enabled, and to output a signal indicative of a fault condition if the measured current in the common conductive path differs from a second expected current when the plurality of current sink subsystems are disabled.

6. Self-test circuitry according to claim 5 wherein the first expected current is based on a predetermined test current value.

7. Self-test circuitry according to claim 6 wherein the second expected current is zero.

8. Self-test circuitry according to claim 5 wherein the current sensing circuitry is further configured to output a signal indicative of a fault condition if the measured current in the common conductive path differs from a second expected current when one the plurality of current sink subsystems is enabled and the others of the plurality of current sink subsystems are disabled.

9. Self-test circuitry according to claim 1 wherein the test voltage source circuitry comprises current generator circuitry and a resistance.

10. Self-test circuitry according to claim 1 wherein the test voltage source circuitry comprises voltage divider circuitry configured to generate the test voltage based on a test voltage source reference voltage.

11. Self-test circuitry according to claim 10 wherein the voltage divider circuitry comprises first and second voltage divider resistances of substantially equal value connected in series such that the test voltage is substantially equal to half of the reference voltage.

12. Self-test circuitry according to claim 1 wherein:
the voltage detection circuitry is configured to output a signal indicative of a short circuit between the load terminal and a system supply voltage if the detected voltage at the measurement node is equal or close to the system supply voltage; and
the voltage detection circuitry is configured to output a signal indicative of a short circuit between the load terminal and a system reference voltage if the detected voltage at the measurement node is equal or close to the system reference voltage.

13. Self-test circuitry according to claim 1 wherein each signal path comprises a controllable switch device for selectively coupling the measurement node to the load terminal of the associated current control subsystem.

14. Self-test circuitry according to claim 1 further comprising a first resistance for each current control subsystem, wherein the first resistance is selectively couplable between the load terminal of the current control subsystem and a system reference voltage.

15. Self-test circuitry according to claim 14 further comprising a controllable coupling switch associated with each first resistance, each controllable coupling switch being configured to selectively couple the associated first resistance to the relevant signal path.

16. Self-test circuitry according to claim 14, wherein the test voltage source circuitry comprises voltage divider circuitry configured to generate the test voltage based on a test voltage source reference voltage, wherein the voltage divider circuitry comprises first and second voltage divider resistances of substantially equal value connected in series such that the test voltage is substantially equal to half of the reference voltage, and wherein a resistance value of each first resistance is substantially equal to the value of the first and second voltage divider resistances.

17. Self-test circuitry according to 14, wherein the one or more current control subsystems comprise one or more current source subsystems and/or one or more current sink subsystems, and wherein the voltage detection circuitry is configured to output a signal indicative of a short circuit between a load terminal of a current source subsystem and a load terminal of a current sink subsystem if the detected voltage at the measurement node is less than the test voltage when the measurement node is coupled to the load terminal of one of the current source subsystem and the current sink subsystem and a first resistance is coupled between the signal path associated with the other of the current source subsystem and the current sink subsystem and the system reference voltage.

18. An integrated circuit comprising self-test circuitry according to claim 1.

19. An electronic device comprising self-test circuitry according to claim 1.

20. An electronic device according to claim 19, wherein the device comprises a mobile telephone, a tablet or laptop computer, a wearable device, a gaming device, a virtual reality or augmented reality device.

21. Self-test circuitry for a system that includes a current source subsystem and a current sink subsystem, wherein the current source subsystem and the current sink subsystem each have a load terminal for coupling to a load, the self-test circuitry comprising:
 a resistance, wherein the resistance is couplable between one of the load terminal of the current source subsystem and the load terminal of the current sink subsystem and a system reference voltage;
 a measurement node, wherein the measurement node is couplable to the other of the load terminal of the current source subsystem and the load terminal of the current sink subsystem;
 test voltage source circuitry configured to provide a test voltage to the measurement node; and
 voltage detection circuitry, wherein the voltage detection circuitry is configured to output a signal indicative of a short circuit between the load terminal of the current source subsystem and the load terminal of the current sink subsystem if the detected voltage at the measurement node differs from the test voltage when the resistance is coupled between the one of the load terminal of the current source subsystem and the load terminal of the current sink subsystem and the system reference voltage and the measurement node is coupled to the other of the load terminal of the current source subsystem and the load terminal of the current sink subsystem.

22. Self-test circuitry according to claim 21, wherein the system reference voltage is 0 volts.

23. Self-test circuitry for a system that includes a current source subsystem, wherein the current source subsystem has a load terminal for coupling to a load, the self-test circuitry comprising:
 current sink circuitry associated with the current source subsystem, the current sink circuitry being selectively couplable to a signal path associated with the current source subsystem; and
 voltage detection circuitry, wherein the voltage detection circuitry is operable to output a signal indicative of a fault condition if a voltage detected at the load terminal of the current source subsystem differs from a first expected voltage when the current source subsystem is disabled or if the detected voltage differs from a second expected voltage when the current source subsystem is enabled.

24. Self-test circuitry for a system that includes a plurality of current sink subsystems, wherein each current sink subsystem has a load terminal for coupling to a load, the self-test circuitry comprising:
 a common conductive path coupled to each of the plurality of current sink subsystems; and
 current sensing circuitry configured to measure a current in the common conductive path,
 wherein the current sensing circuitry is configured to output a signal indicative of a fault condition if the measured current in the common conductive path differs from a first expected current when the plurality of current sink subsystems are enabled, and to output a signal indicative of a fault condition if the measured current in the common conductive path differs from a second expected current when the plurality of current sink subsystems are disabled.

* * * * *

UNITED STATES PATENT AND TRADEMARK OFFICE
CERTIFICATE OF CORRECTION

PATENT NO. : 11,536,767 B2
APPLICATION NO. : 17/065799
DATED : December 27, 2022
INVENTOR(S) : Wells et al.

It is certified that error appears in the above-identified patent and that said Letters Patent is hereby corrected as shown below:

In the Specification

1. In Column 1, Line 67, delete "voltage" and insert -- voltage. --, therefor.

2. In Column 2, Line 67, delete "one the" and insert -- one of the --, therefor.

3. In Column 4, Line 50, delete "120-2" and insert -- 130-2 --, therefor.

4. In Column 5, Line 31, delete "120-1-120-m" and insert -- 130-1-130-m --, therefor.

5. In Column 10, Line 58, delete "in in" and insert -- in --, therefor.

6. In Column 11, Line 9, delete "those or" and insert -- those of --, therefor.

7. In Column 11, Line 34, delete "of the of the" and insert -- of the --, therefor.

8. In Column 12, Line 10, delete "1142-1-114-n" and insert -- 112-1-112-n --, therefor.

9. In Column 13, Line 8, delete "provided in" and insert -- provided to --, therefor.

10. In Column 13, Line 9, delete "114-1-110-n" and insert -- 114-1-114-n --, therefor.

11. In Column 15, Line 9, delete "are be" and insert -- are to be --, therefor.

In the Claims

12. In Column 17, Line 48, in Claim 1, delete "wherein the voltage" and
insert the same on Line 49, before "detection circuitry", as a continuation sub-point.

Signed and Sealed this
Twenty-first Day of November, 2023

Katherine Kelly Vidal
*Director of the United States Patent and Trademark Office*

13. In Column 18, Line 31, in Claim 8, delete "one the" and insert -- one of the --, therefor.

14. In Column 19, Line 14, in Claim 17, delete "according to 14," and insert -- according to claim 14, --, therefor.